United States Patent
Li et al.

(10) Patent No.: US 7,453,584 B2
(45) Date of Patent: *Nov. 18, 2008

(54) EXAMINING A STRUCTURE FORMED ON A SEMICONDUCTOR WAFER USING MACHINE LEARNING SYSTEMS

(75) Inventors: Shifang Li, Pleasanton, CA (US); Junwei Bao, Fremont, CA (US)

(73) Assignee: Timbre Technologies, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/869,591

(22) Filed: Oct. 9, 2007

(65) Prior Publication Data
US 2008/0033683 A1    Feb. 7, 2008

Related U.S. Application Data

(63) Continuation of application No. 11/003,961, filed on Dec. 3, 2004, now Pat. No. 7,280,229.

(51) Int. Cl.
*G01B 11/14* (2006.01)
*G01B 11/24* (2006.01)
*G01B 7/00* (2006.01)

(52) U.S. Cl. ............ 356/625; 356/301; 702/155
(58) Field of Classification Search ........ 356/625, 356/601; 702/155
See application file for complete search history.

(56) References Cited

U.S. PATENT DOCUMENTS

| | | | |
|---|---|---|---|
| 5,479,573 A | 12/1995 | Keeler et al. | |
| 5,793,480 A | 8/1998 | Lacey et al. | |
| 5,889,593 A * | 3/1999 | Bareket | 356/445 |
| 6,023,327 A * | 2/2000 | Shabde et al. | 356/237.1 |
| 6,192,103 B1 | 2/2001 | Wormington et al. | |
| 6,609,086 B1 | 8/2003 | Bao et al. | |

(Continued)

FOREIGN PATENT DOCUMENTS

EP    0448890 A1    10/1991

(Continued)

OTHER PUBLICATIONS

Arthur, G. G. et al. (1997). "Enhancing the Development Rate Model for Optimum Simulation Capability in the Subhalf-Micron Regime," *Proceedings of SPIE* 3049:189-200.

(Continued)

*Primary Examiner*—Patrick Connolly
*Assistant Examiner*—Jonathan Skovholt
(74) *Attorney, Agent, or Firm*—Morrison & Foerster LLP (57) ABSTRACT

A structure formed on a semiconductor wafer is examined by obtaining a first diffraction signal measured from the structure using an optical metrology device. A first profile is obtained from a first machine learning system using the first diffraction signal obtained as an input to the first machine learning system. The first machine learning system is configured to generate a profile as an output for a diffraction signal received as an input. A second profile is obtained from a second machine learning system using the first profile obtained from the first machine learning system as an input to the second machine learning system. The second machine learning system is configured to generate a diffraction signal as an output for a profile received as an input. The first and second profiles include one or more parameters that characterize one or more features of the structure.

20 Claims, 5 Drawing Sheets

U.S. PATENT DOCUMENTS

| | | | |
|---|---|---|---|
| 6,633,831 | B2 | 10/2003 | Nikoonahad et al. |
| 6,650,422 | B2 * | 11/2003 | Singh et al. ............... 356/601 |
| 6,657,736 | B1 | 12/2003 | Finarov et al. |
| 6,665,446 | B1 | 12/2003 | Kato |
| 6,704,661 | B1 * | 3/2004 | Opsal et al. ................. 702/27 |
| 6,771,356 | B1 | 8/2004 | Lyons et al. |
| 6,782,337 | B2 | 8/2004 | Wack et al. |
| 6,785,638 | B2 | 8/2004 | Niu et al. |
| 6,943,900 | B2 | 9/2005 | Niu et al. |
| 6,999,254 | B1 | 2/2006 | Phan et al. |
| 7,043,397 | B2 | 5/2006 | Johnson |
| 7,072,049 | B2 | 7/2006 | Niu et al. |
| 7,092,110 | B2 | 8/2006 | Balasubramanian et al. |
| 7,126,700 | B2 | 10/2006 | Bao et al. |
| 7,158,896 | B1 | 1/2007 | Singh et al. |
| 7,186,650 | B1 | 3/2007 | Dakshina-Murthy |
| 7,216,045 | B2 | 5/2007 | Doddi et al. |
| 7,224,456 | B1 | 5/2007 | Phan et al. |
| 7,224,471 | B2 | 5/2007 | Bischoff et al. |
| 7,280,229 | B2 * | 10/2007 | Li et al. ..................... 356/625 |
| 2003/0028358 | A1 * | 2/2003 | Niu et al. ..................... 703/2 |
| 2004/0017574 | A1 * | 1/2004 | Vuong et al. ............... 356/625 |
| 2004/0150838 | A1 * | 8/2004 | Niu et al. ................... 356/625 |
| 2004/0267397 | A1 | 12/2004 | Doddi et al. |
| 2005/0057748 | A1 | 3/2005 | Vuong et al. |
| 2005/0192914 | A1 | 9/2005 | Drege et al. |
| 2005/0209816 | A1 | 9/2005 | Vuong et al. |
| 2006/0224528 | A1 | 10/2006 | Liu et al. |
| 2007/0185684 | A1 | 8/2007 | Vuong et al. |

OTHER PUBLICATIONS

Brooks, R. A. (1999). "How to Build Complete Creatures Rather than Isolated Cognitive Simulators," MIT, Artificial Intelligence Laboratory, 7 pages, located at <http://people.csail.mit.edu/brooks/papers/how-to-build.pdf>.

Del Jesus, M. J. et al. (Jun. 2004). "Induction of Fuzzy-Rule-Based Classifiers with Evolutionary Boosting Algorithms," *IEEE Transactions on Fuzzy Systems* 12(3):296-308.

Dietterich, T. G. (1997). Machine Learning Research: Four Current Directions, *AI Magazine*, pp. 97-136, located at <http://pages.cs.wisc.edu/~shavlik/Dietterich_AIMag 18-04-010.pdf>.

Gahegan, M. et al. (1999). "Dataspaces as an Organizational Concept for the Neural Classification of Geographic Datasets," GeoComputation, located at <http://www.geovista.psu.edu/sites/geocomp99/Gc99/011/gc_011.htm> visited on Aug. 14, 2007, (8 pages).

Goodridge, S. G. et al. (May 8-13, 1994). "Fuzzy Behavior Fusion for Reactive Control of an Autonomous Mobile Robot: MARGE," *IEEE International Conference on Robotics and Automation*, San Diego, CA, 2:1622-1627.

Haykin, S. (1999). *Neural Networks*. 2nd edition, M. Horton ed., Prentice Hall: Upper Saddle River, New Jersey, 9 pages (Table of Contents).

Horswill, I. D. (2000). "Conflict Resolution," Northwestern University, Computer Science 395 Behavior-Based Robotics, 10 pages, located at <www.cs.northwestern.edu/academics/courses/special_topics/395-robotics/conflict-resolution.pdf>.

Horswill, I. D. (2000). "Functional Programming of Behavior-Based Systems," Northwestern University, Computer Science Department and The Institute for the Learning Sciences, 11 pages, <www.cs.northwestern.edu/~ian/grl-paper.pdf>.

International Search Report and Written Opinion mailed May 16, 2005, for PCT Application No. PCT/US04/20682 filed Jun. 25, 2004, 7 pages.

Keeman, V. (2005). "Support Vector Machine—An Introduction" *In Support Vector Machines: Theory and Applications*. Wang, L. ed., Springer-Verlag Berlin Heidelberg: The Netherlands, pp. 1-47.

Platt, J. C. (1999). "Fast Training of Support Vector Machines Using Sequential Minimal Optimization" Chapter 12 *In Advances in Kernel Methods: Support Vector Learning*. Schölkopf et al. eds., MIT Press: Cambridge, MA, pp. 185-208.

Press, W. H. et al. (1992). *Numerical Recipes in C: The Art of Scientific Computing*. Cambridge University Press, 2nd edition, 8 pages (Table of Contents).

Rowe, N. C. (1990). "Plan Fields and Real-World Uncertainty," AAAI Spring Symposium on Planning in Uncertain, Unpredictable, or Changing Environments, located at <http://www.nps.navy.mil/Content/CS/ncrowe/symp90un.html> visited on Oct. 18, 2007. (4 pages).

Sarkar, M. (Oct. 8-11, 2000). "Modular Pattern Classifiers: A Brief Survey," *IEEE International Conference on Systems, Man & Cybernetics*, Nashville, TN, 4:2878-2883.

U.S. Appl. No. 11/729,498, filed Mar. 28, 2007 for Bischoff et al.
U.S. Appl. No. 11/786,869, filed Apr. 12, 2007 for Jin et al.
U.S. Appl. No. 11/786,870, filed Apr. 12, 2007 for Jin et al.
U.S. Appl. No. 11/787,025, filed Apr. 12, 2007 for Jin et al.

Van Halteren, H. et al. (Jun. 2001). "Improving Accuracy in World Class Tagging Through Combination of Machine Learning Systems," *Computational Linguistics* 27(2):199-229.

Vapnik, V. N. (1998). *Statistical Learning Theory*. John Wiley & Sons, Inc., 15 pages (Table of Contents).

* cited by examiner

Fig. 7

EXAMINING A STRUCTURE FORMED ON A SEMICONDUCTOR WAFER USING MACHINE LEARNING SYSTEMS

CROSS REFERENCE TO RELATED APPLICATION

This application is a Continuation of U.S. patent application Ser. No. 11/003,961, filed on Dec. 3, 2004, which is incorporated herein by reference in its entirety for all purposes.

BACKGROUND

1. Field

The present application relates to semiconductor wafer metrology, and, more particularly, to examining structures formed on semiconductor wafers using machine learning systems.

2. Related Art

In semiconductor manufacturing, metrology is typically used for quality assurance. For example, after fabricating a structure on a semiconductor wafer, a metrology system is used to examine the structure to evaluate the fabrication process utilized to form the structure. The structure can be a feature of an integrated circuit formed on the wafer, or a test structure, such as a periodic grating, formed adjacent to the integrated circuit.

Optical metrology is a type of metrology that involves directing an incident optical signal at the structure, measuring the resulting diffraction signal, and analyzing the diffraction signal to determine a feature of the structure. Machine learning systems have been used to analyze diffraction signals obtained using an optical metrology device. However, these machine learning systems, which generate profiles as outputs based on diffraction signals received as inputs, can produce erroneous results when noise is present in the diffraction signals obtained from the optical metrology device, and when the machine learning system have been trained using a model that is not accurate enough to describe the actual profile of the structure.

SUMMARY

In one exemplary embodiment, a structure formed on a semiconductor wafer is examined by obtaining a first diffraction signal measured from the structure using an optical metrology device. A first profile is obtained from a first machine learning system using the first diffraction signal obtained as an input to the first machine learning system. The first machine learning system is configured to generate a profile as an output for a diffraction signal received as an input. A second profile is obtained from a second machine learning system using the first profile obtained from the first machine learning system as an input to the second machine learning system. The second machine learning system is configured to generate a diffraction signal as an output for a profile received as an input. The first and second profiles include one or more parameters that characterize one or more features of the structure.

DETAILED DESCRIPTION

The following description sets forth numerous specific configurations, parameters, and the like. It should be recognized, however, that such description is not intended as a limitation on the scope of the present invention or applications thereof, but instead provides examples and illustrations.

Figure 1:
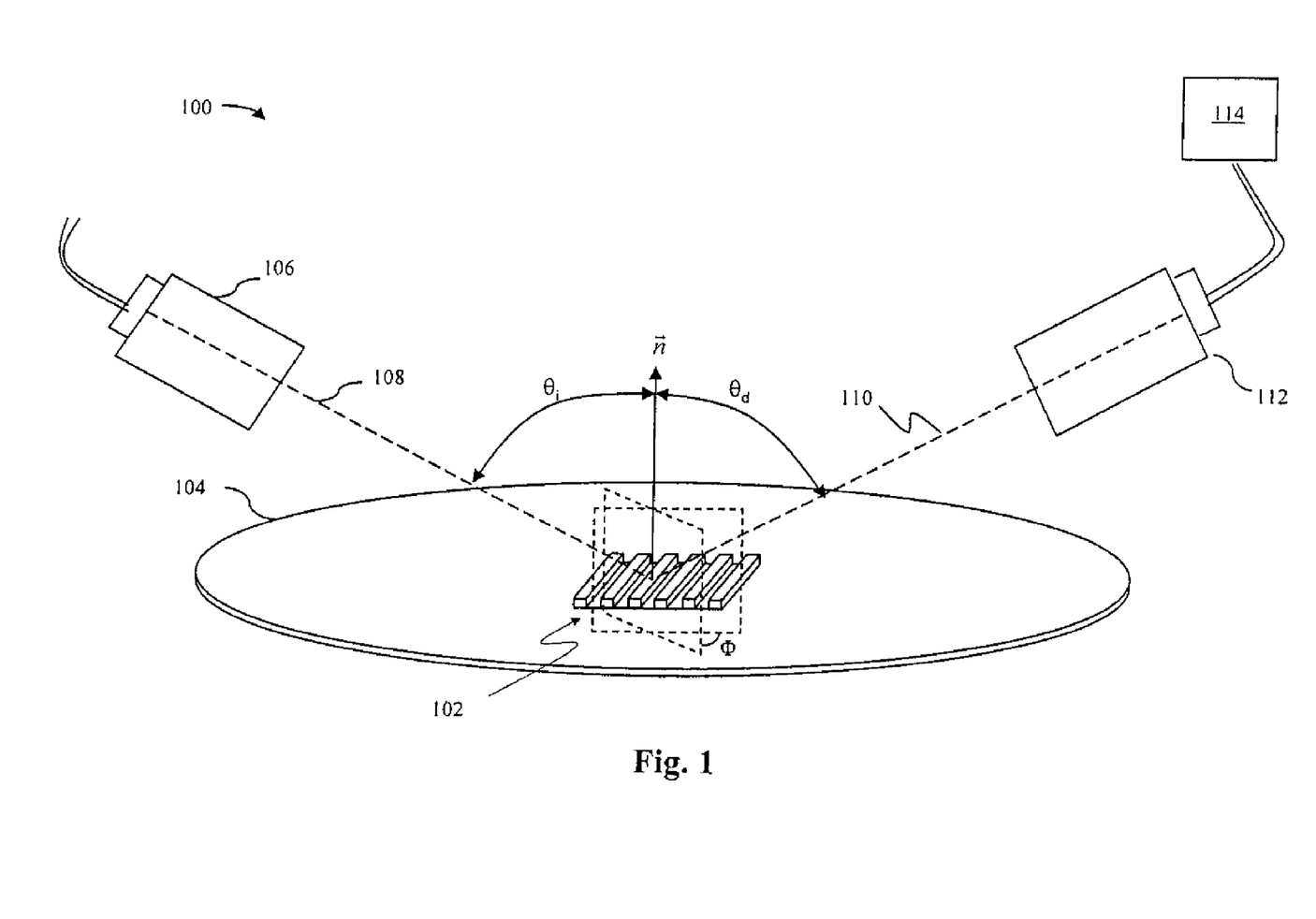
FIG. 1 is a block diagram of an exemplary metrology system.

With reference to FIG. 1, a metrology system 100 can be used to examine a structure formed on a semiconductor wafer 104. For example, metrology system 100 can be used to determine a feature of a periodic grating 102 formed on wafer 104. Periodic grating 102 can be formed in test areas on wafer 104, such as adjacent to a device formed on wafer 104. In examples, periodic grating 102 can be formed in an area of the device that does not interfere with the operation of the device or along scribe lines on wafer 104. It should be recognized that the structure being examined can be any type of structure formed on wafer 104, including a feature of an integrated circuit device.

As depicted in FIG. 1, metrology system 100 can include a metrology device, and in particular, an optical metrology device with a source 106 and a detector 112. Periodic grating 102 is illuminated by an incident beam 108 from source 106. In the present example, incident beam 108 is directed onto periodic grating 102 at an angle of incidence $\theta_i$ with respect to normal $\vec{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal $\vec{n}$ and is received by detector 112. It should be recognized that angles $\theta_i$ and $\theta_d$ can be zero with respect to normal $\vec{n}$. Detector 112 converts the diffracted beam 110 into a measured diffraction signal, which can include reflectance, $\tan(\Psi)$, $\cos(\Delta)$, Fourier coefficients, and the like. The measured diffraction signal can be analyzed in processing module 114.

With reference to FIGS. 2A-2E, in one exemplary embodiment, one or more features of the structure being examined are characterized using a profile defined by one or more parameters. For example, in FIG. 2A, the height and width of a cross section of a structure can be characterized using a profile 200 defined by parameters h1 and w1 corresponding to the height and width, respectively, of the cross section of the structure.

Figure 2A:
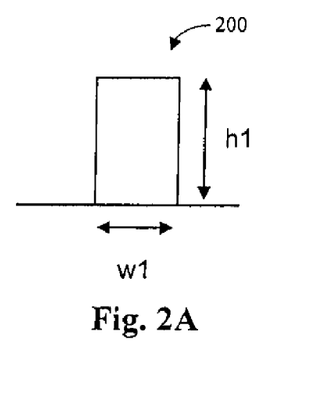
FIG. 2A-E are exemplary profiles that characterize a structure formed on a semiconductor wafer.
Figure 2B:
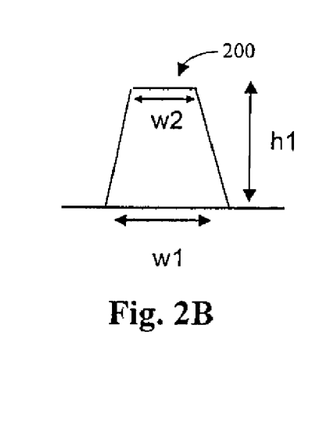
Figure 2C:
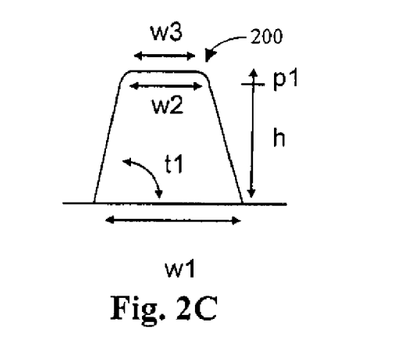
Figure 2D:
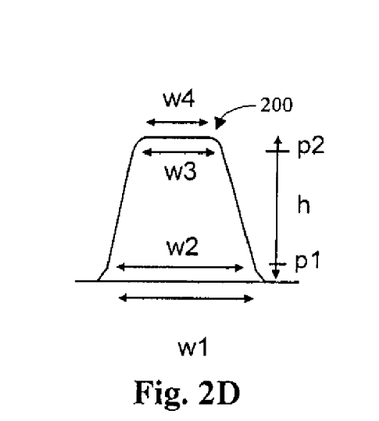
Figure 2E:
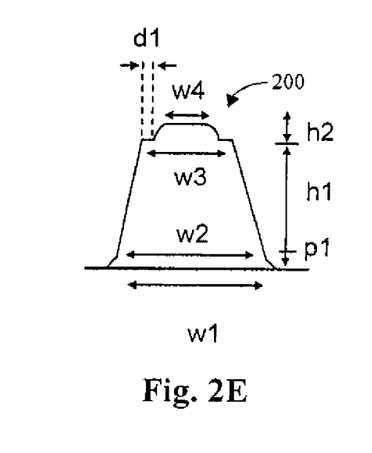

As depicted in FIGS. 2B to 2E, additional features of the structure can be characterized (parameterized) by increasing the number of parameters used to define profile 200. For example, as depicted in FIG. 2B, the height, bottom width, and top width of the structure can be characterized by parameters h1, w1, and w2, respectively. Note that a width can be referred to as a critical dimension (CD). For example, in FIG. 2B, parameter w1 and w2 can be described as defining a bottom CD and a top CD, respectively. It should be recognized that various types of parameters may be used to define a profile, including angle of incident (AOI), pitch, n & k, hardware parameters (e.g., polarizer angle), and the like.

Figure 3:
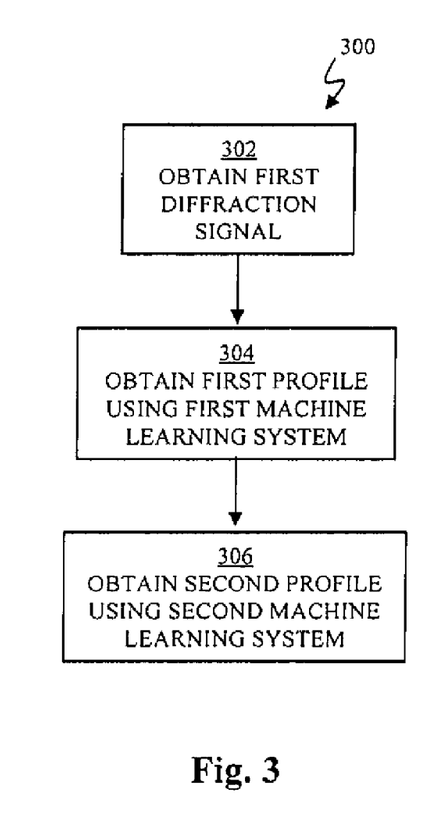
FIG. 3 is a flow chart of an exemplary process to examine a structure using machine learning systems.

With reference to FIG. 3, an exemplary process 300 to examine a structure formed on a wafer is depicted. In step 302, a first diffraction signal measured from the structure using an optical metrology device is obtained. For example, with reference to FIG. 1, a measured diffraction signal can be obtained using source 106 and detector 112 of metrology system 100. It should be recognized, however, that any optical metrology device can be used, such as an ellipsometer, reflectometer, and the like. With reference again to FIG. 3, it should also be recognized that in step 302 the diffraction signal can be directly obtained from the optical metrology device after the diffraction signal is measured using the optical metrology device. Alternatively, the diffraction signal can be measured using optical metrology device, stored, then obtained in step 302.

In step 304, a first profile is obtained from a first machine learning system using the first diffraction signal as an input to the first machine learning system. In the present exemplary embodiment, the first machine learning system is configured to generate a profile as an output when a diffraction signal is received as an input. The first profile obtained from the first machine learning system includes one or more parameters that characterize one or more features of the structure being examined. The first profile obtained using the first machine learning system is a close approximation of the actual profile of the structure (i.e., the first profile is in a global minimum range). However, noise, which is typically present in the first diffraction signal obtained from the optical metrology device, may mean that there is a closer matching profile than the first profile obtained using the first machine learning system (i.e., the first profile is not yet optimized in the global minimum range).

Thus, in step 306, a second profile is obtained from a second machine learning system using the first profile obtained from the first machine learning system as an input to the second machine learning system. In the present exemplary embodiment, the second machine learning system is configured to generate a diffraction signal as an output when a profile is received as an input. The second profile obtained using the second machine learning system is a global minimum, and the closest approximation of the actual profile of the structure. Because the global minimum range was located using the first machine learning system and the second profile is a minimum in the global minimum range, the second profile is the best match for the actual profile of the structure even with noise present.

In the present exemplary embodiment, an iterative process is used to obtain the second profile in step 306. In particular, with reference to FIG. 4, in step 402, the first profile generated as an output of the first machine learning system is used as an input to the second machine learning system. The second machine learning system outputs a second diffraction signal. In step 404, the first diffraction signal obtained from the optical metrology device is compared to the second diffraction signal. In step 406, when the first and second diffraction signals do not match within one or more matching criteria, one or more parameters of the first profile are altered. Examples of matching criteria include goodness of fit, cost, and the like. Steps 402, 404, and 406 are then iterated until the first and second diffraction signals match within the one or more matching criteria.

Figure 4:
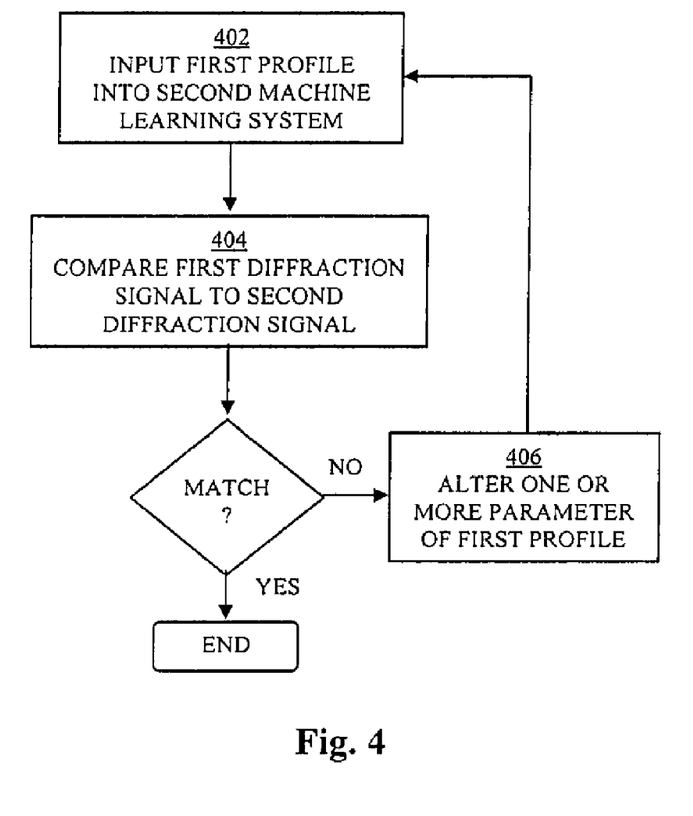
FIG. 4 is a flow chart of an exemplary iterative process that can be used in the exemplary process depicted in FIG. 3.

In iterating steps 402, 404, and 406, an optimization algorithm can be used to more quickly obtain a second diffraction signal that matches the first diffraction signal within the one or more matching criteria. The optimization algorithm can include Gauss-Newton, gradient descent, simulated annealing, Levenberg-Marquardt, and the like. In the present exemplary embodiment, because the global minimum range was located using the first machine learning system, a local optimization algorithm, such as Levenberg-Marquardt, can be used rather than a global optimization algorithm, such as simulated annealing, which is typically much slower than a local optimization algorithm. For more information on such algorithms and optimizations, see U.S. application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety.

Figure 5:
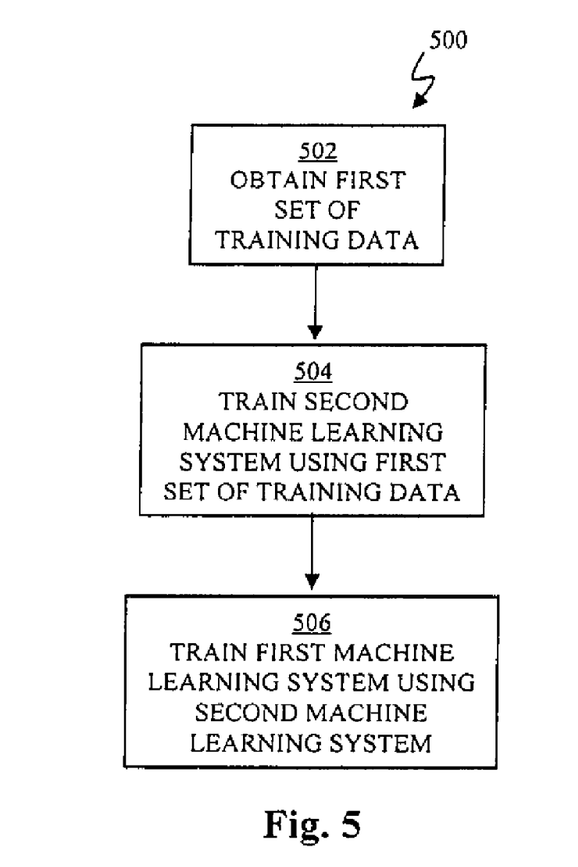
FIG. 5 is a flow chart of an exemplary process to train machine learning systems.

In the present exemplary embodiment, before the first and second machine learning systems are used to examine a structure, the first and second machine learning systems are trained using a training process. With reference to FIG. 5, an exemplary training process 500 is depicted. It should be recognized, however, that the first and second machine learning systems can be trained using various training processes. For more information on machine learning systems and training processes for machine learning systems, see U.S. application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

In step 502, a first set of training data is obtained. The first set of training data includes profile and diffraction signal pairs. Each profile and diffraction signal pair includes a profile and a corresponding diffraction signal. Although there is a one-to-one correspondence between a profile and a diffraction signal in each profile and diffraction signal pair, there need not be a known relationship, either analytic or numeric, between the profile and the diffraction signal.

In one exemplary embodiment, the first set of training data is created by generating a set of profiles by varying one or more parameters, either alone or in combination, that define the profile. An overall range of profiles to be generated can be determined based on an expected range of variability in the actual profile of the structure to be examined. For example, if the actual profile of the structure to be examined is expected to have a bottom width that can vary between $x_1$ and $x_2$, then the overall range of profiles can be generated by varying the parameter corresponding to the bottom width between $x_1$ and $x_2$. Alternatively, the overall range of profiles can be generated based on a random or a systematic sampling of the expected range of variability in the actual profile of the structure.

After generating a set of profiles, diffraction signals are generated for each profile in the set of profiles using a modeling technique, such as rigorous coupled wave analysis (RCWA), integral method, Fresnel method, finite analysis, modal analysis, and the like. Alternatively, the diffraction signals can be generated using an empirical technique, such as measuring a diffraction signal using an optical metrology device, such as an ellipsometer, reflectometer, and the like, or measuring the profile using an atomic force microscope (AFM), scanning electron microscope (SEM), and the like.

In step 504, the second machine learning system is trained using the first set of training data. In particular, using profile and diffraction signal pairs from the first set of training data, the second machine learning system is trained to generate a diffraction signal as an output for a profile received as an input.

In the present exemplary embodiment, in step 506, after the second machine learning system has been trained, the first machine learning system is trained using the second machine learning system. In particular, a second set of training data is generated using the second machine learning system after the second machine learning system has been trained using the first set of training data. The second set of training data includes diffraction signal and profile pairs. A set of profiles is generated by varying one or more parameters, either alone or in combination, that define the profiles. Diffraction signals are generated for the set of profiles using the second machine learning system. The second set of training data can include all or part of the first set of training data.

The second set of training data generated using the second machine learning system is then used to train the first machine learning system. In particular, using diffraction signal and profile pairs from the second set of training data, the first machine learning system is trained to generate a profile as an output for a diffraction signal received as an input.

Figure 6:
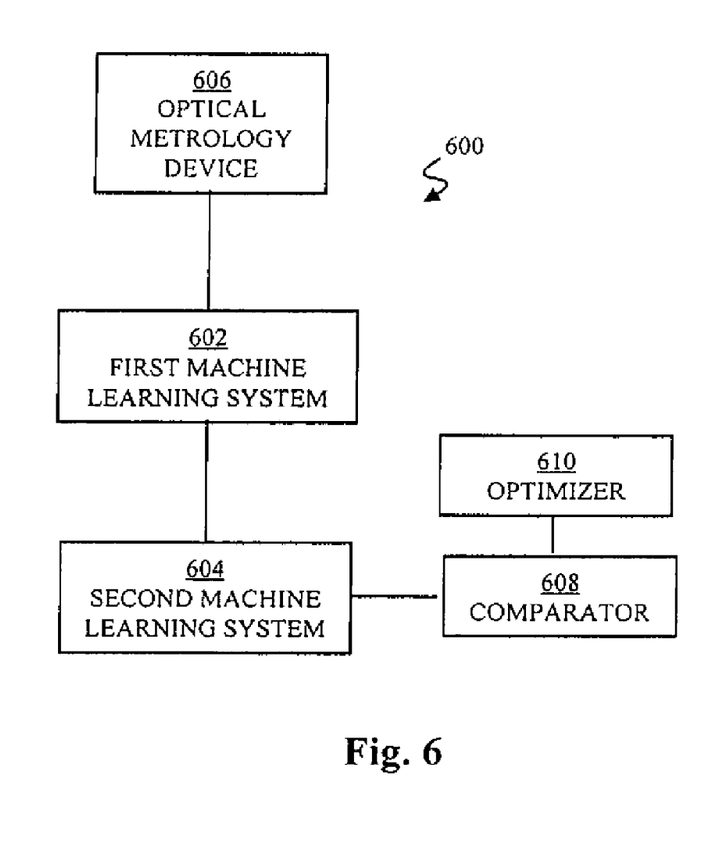
FIG. 6 is a block diagram of an exemplary system to examine a structure using machine learning systems.

With reference to FIG. 6, an exemplary system 600 for examining a structure formed on a semiconductor wafer is depicted. System 600 includes a first machine learning system 602 and a second machine learning system 604. As described above, first machine learning system 602 receives a first diffraction signal measured using metrology device 606. The first diffraction signal is used as an input to first machine learning system 602, which outputs a first profile. A second profile is obtained from second machine learning system 604 using the first profile as an input to second machine learning system 604.

In the present exemplary embodiment, system 600 includes a comparator 608 and an optimizer 610. Comparator 608 and optimizer 610 iteratively obtain the second profile from second machine learning system 604. In particular, comparator 608 compares the second diffraction signal generated as an output from second machine learning system 604 to the first diffraction signal obtained from optical metrology device 606. When the diffraction signals do not match within one or more matching criteria, one or more parameters of the first profile used as an input to second machine learning system 604 are altered to generate another second diffraction signal. Optimizer 610 applies an optimization algorithm to more quickly obtain a second diffraction signal that matches the first diffraction signal within the one or more matching criteria. The second profile is the same as the first profile that was used as the input to second machine learning system 604 to generate the second diffraction signal that matched the first diffraction signal within the one or more matching criteria.

In one exemplary embodiment, first machine learning system 602 and second machine learning system 604 can be implemented as components of processor 114 (FIG. 1) of metrology system 100 (FIG. 1). Optical metrology device 606 can include source 106 (FIG. 1) and detector 116 (FIG. 1). It should be recognized, however, that first machine learning system 602 and second machine learning system 604 can be implemented as one or more modules separate from processor 114 (FIG. 1) and metrology system 100 (FIG. 1).

Additionally, first machine learning system 602, second machine learning system 604, and optical metrology device 606 can be located in one physical location or in separate physical locations. For example, optical metrology device 606 can be located in one physical location to measure a first diffraction signal. The first diffraction signal can then be transmitted to first machine learning system 602 and second machine learning system 604 located in another physical location separate from the physical location of optical metrology device 606.

It should be recognized that first machine learning system 602 and second machine learning system 604 can be implemented using software, hardware, or combination of software and hardware. Hardware can include general purpose processors, application specific integrated circuits (ASICs), field programmable gate arrays (FPGAs), and the like.

Figure 7:
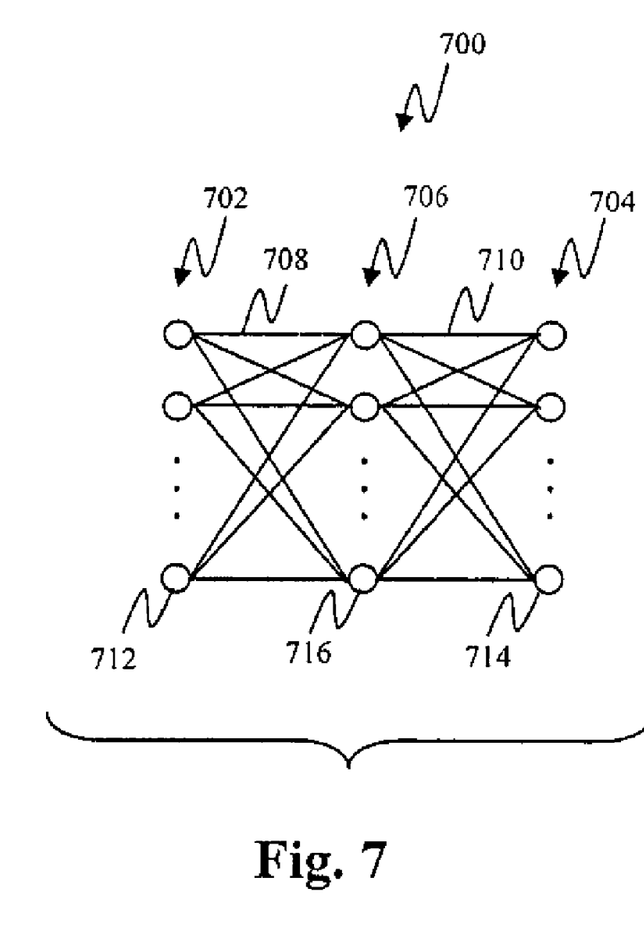
FIG. 7 is a block diagram of an exemplary neural network.

In one exemplary embodiment, first machine learning system 602 and second machine learning system 604 are neural networks. With reference to FIG. 7, an exemplary neural network 700 is depicted. Neural network 700 uses a back-propagation algorithm. Neural network 700 includes an input layer 702, an output layer 704, and a hidden layer or layers 706 between input layer 702 and output layer 704. Input layer 702 and hidden layer 706 are connected using links 708. Hidden layer 706 and output layer 704 are connected using links 710. It should be recognized, however, that neural network 700 can include any number of layers connected in various configurations. For a more detailed description of machine learning systems and algorithms, see "Neural Networks" by Simon Haykin, Prentice Hall, 1999, which is incorporated herein by reference in its entirety.

As depicted in FIG. 7, input layer 702 includes one or more input nodes 712. In an exemplary implementation, an input node 712 in input layer 702 corresponds to a parameter of a profile that is inputted into neural network 700. Thus, the number of input nodes 712 corresponds to the number of parameters used to characterize the profile. For example, if a profile is characterized using two parameters (e.g., top and bottom widths), input layer 702 includes two input nodes 712, where a first input node 712 corresponds to a first parameter (e.g., a top width) and a second input node 712 corresponds to a second parameter (e.g., a bottom width).

The foregoing descriptions of exemplary embodiments have been presented for purposes of illustration and description. They are not intended to be exhaustive or to limit the invention to the precise forms disclosed, and it should be understood that many modifications and variations are possible in light of the above teaching.

We claim:

1. A method of examining a structure formed on a semiconductor wafer, the method comprising:
   a) obtaining a first diffraction signal measured from the structure using an optical metrology device;
   b) inputting the first diffraction signal as an input to a first machine learning system;
   c) after b), receiving a profile as an output of the first machine learning system with the first diffraction signal as the input to the first machine learning system, the profile having one or more parameters that characterize one or more features of the structure;
   d) after c), inputting the profile as an input to a second machine learning system;
   e) after d), receiving a second diffraction signal as an output of the second machine learning system with the profile as the input to the second machine learning system;
   f) comparing the first diffraction signal to the second diffraction signal;
   g) when the first and second diffraction signals match within one or more matching criteria, determining one or more features of the structure to be those characterized by the one or more parameters of the profile used as the input to the second machine learning system; and
   h) when the first and second diffraction signals do not match within one or more matching criteria, altering one or more parameters of the profile and iterating steps d)-f) using the profile with the altered one or more parameters.

2. The method of claim 1, wherein the one or more parameters of the profile include critical dimensions of the structure.

3. The method of claim 2, wherein the critical dimensions include a top width or bottom width of the structure.

4. The method of claim 2, wherein the critical dimensions include a height of the structure.

5. The method of claim 1, wherein the one or more matching criteria include goodness of fit.

6. The method of claim 1, wherein the one or more matching criteria include cost.

7. The method of claim 1, wherein a local optimization algorithm is applied in iterating steps d)-f).

8. The method of claim 7, wherein the local optimization algorithm is a Levenberg-Marquardt algorithm.

9. The method of claim 1, wherein the second machine learning system was trained using a training process, the training process comprising:
   obtaining a first set of training data, the first set of training data having profile and diffraction signal pairs; and
   using the profile and diffraction signal pairs from the first set of training data to train the second machine learning system to generate a diffraction signal as an output for a profile received as an input.

10. The method of claim 9, wherein the first machine learning system was trained using the training process, the training process further comprising:
    generating a second set of training data using the second machine learning system after the second machine learning system has been trained using the first set of training data, the second set of training data having diffraction signal and profile pairs; and
    using the diffraction signal and profile pairs from the second set of training data to train the first machine learning system to generate a profile as an output for a diffraction signal received as an input.

11. The method of claim 9, wherein the diffraction signals in the first set of training data were generated using a modeling technique prior to training the first and second machine learning systems.

12. The method of claim 11, wherein the modeling technique includes rigorous coupled wave analysis, integral method, Fresnel method, finite analysis, or modal analysis.

13. The method of claim 1, wherein the first and second machine learning systems are neural networks.

14. A computer-readable storage medium containing computer executable instructions for causing a computer to examine a structure formed on a semiconductor wafer, comprising instructions for:
    a) obtaining a first diffraction signal measured from the structure using an optical metrology device;
    b) inputting the first diffraction signal as an input to a first machine learning system;
    c) after b), receiving a profile as an output of the first machine learning system with the first diffraction signal as the input to the first machine learning system, the profile having one or more parameters that characterize one or more features of the structure;
    d) after c), inputting the profile as an input to a second machine learning system;
    e) after d), receiving a second diffraction signal as an output of the second machine learning system with the profile as the input to the second machine learning system;
    f) comparing the first diffraction signal to the second diffraction signal;
    g) when the first and second diffraction signals match within one or more matching criteria, determining one or more features of the structure to be those characterized by the one or more parameters of the profile used as the input to the second machine learning system; and
    h) when the first and second diffraction signals do not match within one or more matching criteria, altering one or more parameters of the profile and iterating steps d)-f) using the profile with the altered one or more parameters.

15. The computer-readable storage medium of claim 14, wherein the one or more parameters of the profile include critical dimensions of the structure.

16. The computer-readable storage medium of claim 15, wherein the critical dimensions include a top width or bottom width of the structure.

17. The computer-readable storage medium of claim 14, wherein a local optimization algorithm is applied in iterating steps d)-f).

18. A system to examine a structure formed on a semiconductor wafer, the system comprising:
    a first machine learning system configured to receive a first diffraction signal and generate a profile as an output, wherein the profile includes one or more parameters that characterize one or more features of the structure;
    a second machine learning system configured to receive the profile generated as the output from the first machine learning system and generate a second diffraction signal; and
    a comparator configured to compare the first diffraction signal and the second diffraction signal, wherein one or more features of the structure are determined to be characterized by the one or more parameters of the profile when the first and second diffraction signals match within one or more matching criteria.

19. The system of claim 18, further comprising:
    an optimizer configured to apply an optimization algorithm to obtain a diffraction signal that matches the first diffraction signal within the one or more matching criteria.

20. The system of claim 18, further comprising:
    an optical metrology device configured to measure a diffraction signal from the structure, wherein the first diffraction signal received by the first machine learning system is measured using the optical metrology device.

* * * * *